US010438833B2

(12) United States Patent
Severson et al.

(10) Patent No.: US 10,438,833 B2
(45) Date of Patent: Oct. 8, 2019

(54) WAFER LIFT RING SYSTEM FOR WAFER TRANSFER

(71) Applicant: LAM RESEARCH CORPORATION, Fremont, CA (US)

(72) Inventors: Brian Severson, Queen Creek, AZ (US); Ivelin Angelov, San Jose, CA (US); James Eugene Caron, Tracy, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 275 days.

(21) Appl. No.: 15/427,528

(22) Filed: Feb. 8, 2017

(65) Prior Publication Data

US 2017/0236743 A1 Aug. 17, 2017

Related U.S. Application Data

(60) Provisional application No. 62/295,808, filed on Feb. 16, 2016.

(51) Int. Cl.
*H01L 21/68* (2006.01)
*H01L 21/687* (2006.01)

(52) U.S. Cl.
CPC .. *H01L 21/68742* (2013.01); *H01L 21/68735* (2013.01)

(58) Field of Classification Search
CPC ................... H01L 21/68735; H01L 21/68742
See application file for complete search history.

(56) References Cited

U.S. PATENT DOCUMENTS

| 4,374,698 A | 2/1983 | Sanders et al. |
| 4,431,477 A | 2/1984 | Zajac |
| 4,793,897 A | 12/1988 | Dunfield et al. |
| 5,329,965 A | 7/1994 | Gordon |
| 5,605,179 A | 2/1997 | Strong, Jr. et al. |
| 5,660,673 A | 8/1997 | Miyoshi |
| 5,662,143 A | 9/1997 | Caughran |
| 5,744,695 A | 4/1998 | Forbes |

(Continued)

FOREIGN PATENT DOCUMENTS

| EP | 0424299 A2 | 4/1991 |
| EP | 0424299 A3 | 8/1991 |

(Continued)

OTHER PUBLICATIONS

U.S. Appl. No. 14/945,680, filed Nov. 19, 2015, John Drewery.

(Continued)

*Primary Examiner* — Ronald P Jarrett

(57) ABSTRACT

A substrate support includes an inner portion arranged to support a substrate, a lift ring surrounding the inner portion, the lift ring arranged to support an outer edge of the substrate, and a controller configured to control an actuator to adjust a height of the lift ring relative to the inner portion by selectively raising and lowering at least one of the lift ring and the inner portion of the substrate support. To adjust the height of the lift ring, the controller selectively adjusts the height of the lift ring to a transfer height for transfer of the substrate to the lift ring and retrieval of the substrate from the lift ring, and adjusts the height of the lift ring to a processing height for processing of the substrate.

12 Claims, 7 Drawing Sheets

(56) References Cited

U.S. PATENT DOCUMENTS

| | | |
|---|---|---|
| 5,762,714 A | 6/1998 | Mohn et al. |
| 6,022,809 A | 2/2000 | Fan |
| 6,042,687 A | 3/2000 | Singh et al. |
| 6,044,534 A | 4/2000 | Seo et al. |
| 6,060,400 A | 5/2000 | Oehrlein et al. |
| 6,074,959 A | 6/2000 | Wang et al. |
| 6,152,168 A | 11/2000 | Ohmi et al. |
| 6,206,976 B1 | 3/2001 | Crevasse et al. |
| 6,210,593 B1 | 4/2001 | Ohkuni et al. |
| 6,376,386 B1 | 4/2002 | Oshima |
| 6,589,352 B1 | 7/2003 | Yudovsky et al. |
| 6,744,212 B2 | 6/2004 | Fischer et al. |
| 6,841,943 B2 | 1/2005 | Vahedi et al. |
| 6,896,765 B2 | 5/2005 | Steger |
| 6,898,558 B2 | 5/2005 | Klekotka |
| 6,962,879 B2 | 11/2005 | Zhu et al. |
| 7,129,171 B2 | 10/2006 | Zhu et al. |
| 7,288,482 B2 | 10/2007 | Panda et al. |
| 7,309,646 B1 | 12/2007 | Heo et al. |
| 7,338,907 B2 | 3/2008 | Li et al. |
| 7,757,541 B1 | 7/2010 | Monkowski et al. |
| 7,758,698 B2 | 7/2010 | Bang et al. |
| 7,968,469 B2 | 6/2011 | Collins et al. |
| 8,137,463 B2 | 3/2012 | Liu et al. |
| 8,552,334 B2 | 10/2013 | Tappan et al. |
| 8,555,920 B2 | 10/2013 | Hirata et al. |
| 8,592,328 B2 | 11/2013 | Hausmann et al. |
| 8,889,024 B2 | 11/2014 | Watanabe et al. |
| 8,956,980 B1 | 2/2015 | Chen et al. |
| 8,999,106 B2 | 4/2015 | Liu et al. |
| 9,011,637 B2 | 4/2015 | Yamamoto |
| 9,051,647 B2 | 6/2015 | Cooperberg et al. |
| 9,059,678 B2 | 6/2015 | Long et al. |
| 9,142,391 B2 | 9/2015 | Yamamoto |
| 9,318,343 B2 | 4/2016 | Ranjan et al. |
| 9,471,065 B2 | 10/2016 | Koyomogi et al. |
| 9,640,409 B1 | 5/2017 | Yang et al. |
| 2001/0002581 A1 | 6/2001 | Nishikawa et al. |
| 2001/0004903 A1 | 6/2001 | Ohmi et al. |
| 2001/0013363 A1 | 8/2001 | Kitayama et al. |
| 2002/0038669 A1 | 4/2002 | Yamagishi et al. |
| 2002/0042205 A1 | 4/2002 | McMillin et al. |
| 2002/0045265 A1 | 4/2002 | Bergh et al. |
| 2002/0046991 A1 | 4/2002 | Smith et al. |
| 2002/0048536 A1 | 4/2002 | Bergh et al. |
| 2002/0072240 A1 | 6/2002 | Koike |
| 2002/0160125 A1 | 10/2002 | Johnson et al. |
| 2002/0174905 A1 | 11/2002 | Latino et al. |
| 2002/0176144 A1 | 11/2002 | Hung et al. |
| 2003/0201069 A1 | 10/2003 | Johnson |
| 2003/0236592 A1 | 12/2003 | Shajii et al. |
| 2003/0236638 A1 | 12/2003 | Shajii et al. |
| 2003/0236643 A1 | 12/2003 | Shajii et al. |
| 2004/0053428 A1 | 3/2004 | Steger |
| 2004/0094206 A1 | 5/2004 | Ishida |
| 2004/0112539 A1 | 6/2004 | Larson et al. |
| 2004/0112540 A1 | 6/2004 | Larson et al. |
| 2004/0112638 A1 | 6/2004 | Larson et al. |
| 2004/0149389 A1 | 8/2004 | Fink |
| 2004/0163601 A1 | 8/2004 | Kadotani et al. |
| 2004/0168719 A1 | 9/2004 | Nambu |
| 2004/0173270 A1 | 9/2004 | Harris et al. |
| 2004/0200529 A1 | 10/2004 | Lull et al. |
| 2005/0005994 A1 | 1/2005 | Sugiyama et al. |
| 2005/0067021 A1 | 3/2005 | Bevers et al. |
| 2005/0082007 A1* | 4/2005 | Nguyen .............. H01J 37/321 |
| | | 156/345.51 |
| 2005/0166625 A1 | 7/2005 | Jangjian et al. |
| 2005/0199342 A1 | 9/2005 | Shajii et al. |
| 2005/0241763 A1 | 11/2005 | Huang et al. |
| 2006/0011237 A1 | 1/2006 | Tison et al. |
| 2006/0097644 A1 | 5/2006 | Kono et al. |
| 2006/0124169 A1 | 6/2006 | Mizusawa et al. |
| 2006/0207595 A1 | 9/2006 | Ohmi et al. |
| 2006/0237063 A1 | 10/2006 | Ding et al. |
| 2007/0026684 A1 | 2/2007 | Parascandola et al. |
| 2007/0066038 A1 | 3/2007 | Sadjadi et al. |
| 2007/0158025 A1 | 7/2007 | Larson |
| 2007/0175391 A1 | 8/2007 | Mizusawa |
| 2007/0233412 A1 | 10/2007 | Gotoh et al. |
| 2007/0240778 A1 | 10/2007 | L'Bassi et al. |
| 2007/0259112 A1 | 11/2007 | Ishikawa et al. |
| 2008/0115834 A1 | 5/2008 | Geoffrion et al. |
| 2008/0121178 A1 | 5/2008 | Bang et al. |
| 2008/0202588 A1 | 8/2008 | Gold et al. |
| 2008/0202609 A1 | 8/2008 | Gold et al. |
| 2008/0202610 A1 | 8/2008 | Gold et al. |
| 2008/0223873 A1 | 9/2008 | Chen et al. |
| 2008/0236749 A1 | 10/2008 | Koshimizu et al. |
| 2009/0056629 A1 | 3/2009 | Katz et al. |
| 2009/0061083 A1 | 3/2009 | Chiang et al. |
| 2009/0061640 A1 | 3/2009 | Wong et al. |
| 2009/0061644 A1 | 3/2009 | Chiang et al. |
| 2009/0067954 A1 | 3/2009 | Lanee et al. |
| 2009/0095364 A1 | 4/2009 | Itoh et al. |
| 2009/0183548 A1 | 7/2009 | Monkowski et al. |
| 2009/0183549 A1 | 7/2009 | Monkowski et al. |
| 2009/0197423 A1 | 8/2009 | Koshimizu et al. |
| 2009/0221117 A1 | 9/2009 | Tan et al. |
| 2009/0272717 A1 | 11/2009 | Pamarthy et al. |
| 2009/0320754 A1 | 12/2009 | Oya et al. |
| 2010/0012310 A1 | 1/2010 | Christensen et al. |
| 2010/0025369 A1 | 2/2010 | Negishi et al. |
| 2010/0030390 A1 | 2/2010 | Yamaguchi et al. |
| 2010/0071438 A1 | 3/2010 | Davis et al. |
| 2010/0144539 A1 | 6/2010 | Bergh et al. |
| 2010/0145633 A1 | 6/2010 | Yasuda |
| 2010/0178770 A1 | 7/2010 | Zin |
| 2010/0229976 A1 | 9/2010 | Hirata et al. |
| 2010/0264117 A1 | 10/2010 | Ohmi et al. |
| 2010/0269924 A1 | 10/2010 | Yasuda |
| 2011/0019332 A1 | 1/2011 | Chistyakov |
| 2011/0031111 A1 | 2/2011 | Kobayashi |
| 2011/0094596 A1 | 4/2011 | Sugiyama et al. |
| 2011/0135821 A1 | 6/2011 | Ding |
| 2011/0253225 A1 | 10/2011 | Beeby et al. |
| 2011/0265883 A1 | 11/2011 | Cruse et al. |
| 2011/0287631 A1 | 11/2011 | Yamamoto |
| 2011/0303696 A1 | 12/2011 | Kelekar et al. |
| 2012/0031500 A1 | 2/2012 | Hirose et al. |
| 2012/0034786 A1 | 2/2012 | Dhindsa et al. |
| 2012/0097266 A1 | 4/2012 | Cobb et al. |
| 2012/0149213 A1 | 6/2012 | Nittala et al. |
| 2012/0152364 A1 | 6/2012 | Hashimoto et al. |
| 2012/0174990 A1 | 7/2012 | Yasuda |
| 2012/0190208 A1 | 7/2012 | Ozu et al. |
| 2012/0238102 A1 | 9/2012 | Zhang et al. |
| 2012/0238103 A1 | 9/2012 | Zhang et al. |
| 2012/0244715 A1 | 9/2012 | Lebouitz et al. |
| 2012/0289057 A1 | 11/2012 | DeDontney |
| 2012/0298221 A1 | 11/2012 | Takeuchi et al. |
| 2012/0305184 A1 | 12/2012 | Singh et al. |
| 2012/0328780 A1 | 12/2012 | Yamagishi |
| 2013/0008607 A1 | 1/2013 | Matsumoto et al. |
| 2013/0025715 A1 | 1/2013 | Yamaguchi et al. |
| 2013/0029494 A1 | 1/2013 | Sasaki et al. |
| 2013/0029496 A1 | 1/2013 | Bauer et al. |
| 2013/0045605 A1 | 2/2013 | Wang et al. |
| 2013/0085618 A1 | 4/2013 | Ding |
| 2013/0104996 A1 | 5/2013 | Oh et al. |
| 2013/0106286 A1 | 5/2013 | Banna et al. |
| 2013/0131300 A1 | 5/2013 | Olmscheid et al. |
| 2013/0145816 A1 | 6/2013 | Lowe |
| 2013/0157388 A1 | 6/2013 | Grimbergen |
| 2013/0220433 A1 | 8/2013 | Sawada et al. |
| 2013/0270997 A1 | 10/2013 | Zhao et al. |
| 2014/0033828 A1 | 2/2014 | Larson et al. |
| 2014/0080308 A1 | 3/2014 | Chen et al. |
| 2014/0120737 A1 | 5/2014 | Swaminathan et al. |
| 2014/0141621 A1 | 5/2014 | Ren et al. |
| 2014/0144471 A1 | 5/2014 | Kahlon et al. |
| 2014/0182689 A1 | 7/2014 | Shareef et al. |
| 2014/0213055 A1 | 7/2014 | Himori et al. |
| 2014/0248780 A1 | 9/2014 | Ingle et al. |

(56) References Cited

U.S. PATENT DOCUMENTS

| | | |
|---|---|---|
| 2014/0262038 A1 | 9/2014 | Wang et al. |
| 2014/0273460 A1 | 9/2014 | Reyland et al. |
| 2015/0010381 A1* | 1/2015 | Cai .................. H01L 21/67745 414/806 |
| 2015/0017810 A1 | 1/2015 | Guha |
| 2015/0059859 A1 | 3/2015 | Takahashi et al. |
| 2015/0181684 A1 | 6/2015 | Banna et al. |
| 2015/0184287 A1 | 7/2015 | Tsung et al. |
| 2015/0287572 A1 | 10/2015 | Daugherty et al. |
| 2015/0340209 A1 | 11/2015 | Koltonski |
| 2015/0371831 A1 | 12/2015 | Rozenzon et al. |
| 2016/0111258 A1 | 4/2016 | Taskar et al. |
| 2016/0181116 A1 | 6/2016 | Berry, III et al. |
| 2016/0211165 A1 | 7/2016 | McChesney et al. |
| 2016/0211166 A1 | 7/2016 | Yan et al. |
| 2016/0215392 A1 | 7/2016 | Yudovsky et al. |
| 2016/0247688 A1 | 8/2016 | Zhu et al. |
| 2017/0018407 A1 | 1/2017 | Kondo |
| 2017/0032982 A1 | 2/2017 | Drewery et al. |
| 2017/0069511 A1 | 3/2017 | Yang et al. |
| 2017/0110335 A1 | 4/2017 | Yang et al. |
| 2017/0200586 A1 | 7/2017 | Treadwell et al. |
| 2017/0236694 A1 | 8/2017 | Eason et al. |

FOREIGN PATENT DOCUMENTS

| | | |
|---|---|---|
| EP | 0838842 A2 | 4/1998 |
| WO | WO-0040776 A1 | 7/2000 |
| WO | WO-2011051251 A1 | 5/2011 |
| WO | WO-2013123617 A1 | 8/2013 |
| WO | WO-2014068886 A1 | 5/2014 |

OTHER PUBLICATIONS

U.S. Appl. No. 15/013,400, filed Feb. 2, 2016, Yang et al.
U.S. Appl. No. 15/014,539, filed Feb. 3, 2016, Yang et al.
U.S. Appl. No. 15/399,692, filed Jan. 5, 2017, Treadwell et al.
U.S. Appl. No. 15/427,163, filed Feb. 8, 2017, Kwame Eason et al.
U.S. Appl. No. 62/275,837, filed Jan. 7, 2016, Jason Lee Treadwell et al.
Bohr, Mark, "The New Era of Scaling in an SoC World" Intel Logic Technology Development; ISSCC; 2009; 66 Pages.
Dusa, Mircean et al., "Pitch Doubling Through Dual Patterning Lithography Challenges in Integration and Litho Budgets," Optical Microlithography XX, vol. 6520, 65200G, (2007); 10 pages.
U.S. Office Action dated Oct. 5, 2015 issued in U.S. Appl. No. 14/576,020.
Blain et al. (Jul./Aug. 1996) "Role of nitrogen in the downstream etching of silicon nitride," Journal of Vacuum Science & Technology A, 14(4):2151-2157.
Blain (Mar./ Apr. 1999) "Mechanism of nitrogen removal from silicon nitride by nitric oxide," Journal of Vacuum Science & Technology A, 17(2):665-667.
Kastenmeier et al. (Nov./Dec. 1999) "Highly selective etching of silicon nitride over silicon and silicon dioxide," J. Vac. Sci. Technol. A, American Vacuum Society, I7 (6):3179-3184.
Kastenmeier et al. (Sep./Oct. 1996) "Chemical dry etching of silicon nitride and silicon dioxide using CF4/02/N2 gas mixtures," J. Vac. Sci. Technol. A14(5):2802-2813.
Oehrlein et al. (1996) "Study of plasma-surface interactions: chemical dry etching and high-density plasma etching," Plasma Sources Sci. Technol. 5:193-199.
Tajima et al. (2013) "Room-Temperature Si Etching in NO/F2 Gases and the Investigation of Surface Reaction Mechanisms," The Journal of Physical Chemistry C, 117:5118-5125.
Yun et al. (2007) "Large Etch Rate Enhancement by NO-Induced Surface Chemical Reaction during Chemical Dry Etching of Silicon Oxide in F2 Remote Plasmas," Journal of The Electrochemical Society, 154(4):D267-D272.
U.S. Final Ofice Action dated Feb. 26, 2016 issued in U.S. Appl. No. 14/576,020.
U.S. Office Action dated Sep. 23, 2016 issued in U.S. Appl. No. 14/576,020.
European Extended Search Report dated May 30, 2016 issued in EP 15 199 363.1.
U.S. Appl. No. 62/106,407, filed Jan. 22, 2015, in the names of Joseph Yudovsky et al., & entitled "Injector for Spatially Separated Atomic Layer Deposition Chamber" pp. 1-68. (Year: 2015).
US PPA No. 620065497, entitled "Gas Supply Delivery Arrangement Including a Gas Splitter for Tunable Gas Flow Control," filed Oct. 17, 2014, in the names of Mark Taskar et al. (Year: 2014).
MP125E N-470 Linear Drive User Manual; Version 1.1.0: Date Sep. 18, 2014; 54 Pages; Physik Instrumente (PI) GmbH & Co. KG, Auf der Roemerstr. 1, 76228 Karlsruhe, Germany.
First Office Action dated Dec. 29, 2017 corresponding to Chinese Patent Application No. 201610032252.1, 12 pages.
First Office Action dated Aug. 2, 2018 corresponding to Chinese Patent Application No. 201710036188.9, 7 pages.

* cited by examiner

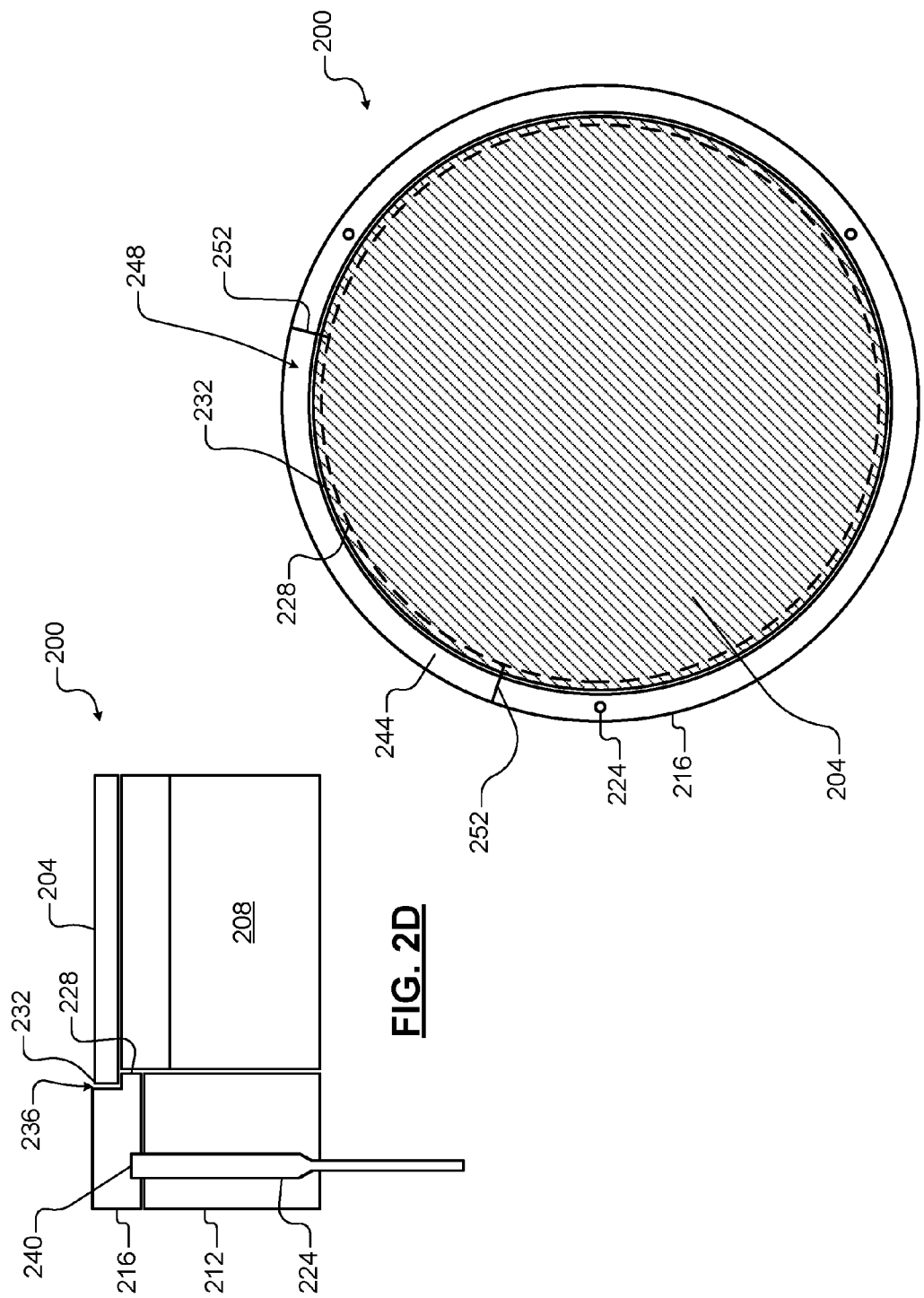

WAFER LIFT RING SYSTEM FOR WAFER TRANSFER

CROSS-REFERENCE TO RELATED APPLICATIONS

This application claims the benefit of U.S. Provisional Application No. 62/295,808, filed on Feb. 16, 2016. The entire disclosures of the applications referenced above are incorporated herein by reference.

FIELD

The present disclosure relates to systems and methods for lifting a substrate or wafer from a substrate support in a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A substrate processing system may be used to etch film on a substrate such as a semiconductor wafer. The substrate processing system typically includes a processing chamber, a gas distribution device and a substrate support (e.g., an electrostatic chuck, or ESC). During processing, the substrate is arranged on the substrate support. Different gas mixtures may be introduced into the processing chamber and radio frequency (RF) plasma may be used to activate chemical reactions.

The substrate support may include a lift mechanism for lifting and lowering the substrate for transfer to and from the substrate support, during processing, etc. For example, one or more lift pins may be arranged in the substrate support below the substrate. The lift pins are selectively controlled (e.g., electromechanically, pneumatically, etc.) to engage a bottom surface of the substrate to raise and lower the substrate relative to the substrate support.

SUMMARY

A substrate support includes an inner portion arranged to support a substrate, a lift ring surrounding the inner portion, the lift ring arranged to support an outer edge of the substrate, and a controller configured to control an actuator to adjust a height of the lift ring relative to the inner portion by selectively raising and lowering at least one of the lift ring and the inner portion of the substrate support. To adjust the height of the lift ring, the controller selectively adjusts the height of the lift ring to a transfer height for transfer of the substrate to the lift ring and retrieval of the substrate from the lift ring, and adjusts the height of the lift ring to a processing height for processing of the substrate. The processing height is lower than the transfer height.

A method of operating a substrate support includes providing a lift ring arranged to surround an inner portion of the substrate support and to support an outer edge of a substrate and controlling an actuator to adjust a height of the lift ring relative to the inner portion by selectively raising and lowering at least one of the lift ring and the inner portion of the substrate support. Adjusting the height of the lift ring includes selectively adjusting the height of the lift ring to a transfer height for transfer of the substrate to the lift ring and retrieval of the substrate from the lift ring and adjusting the height of the lift ring to a processing height for processing of the substrate, wherein the processing height is lower than the transfer height.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 2A through 2E show example substrate supports having a lift ring according to the present disclosure;

In the drawings, reference numbers may be reused to identify similar and/or identical elements.

DETAILED DESCRIPTION

Figure 1:
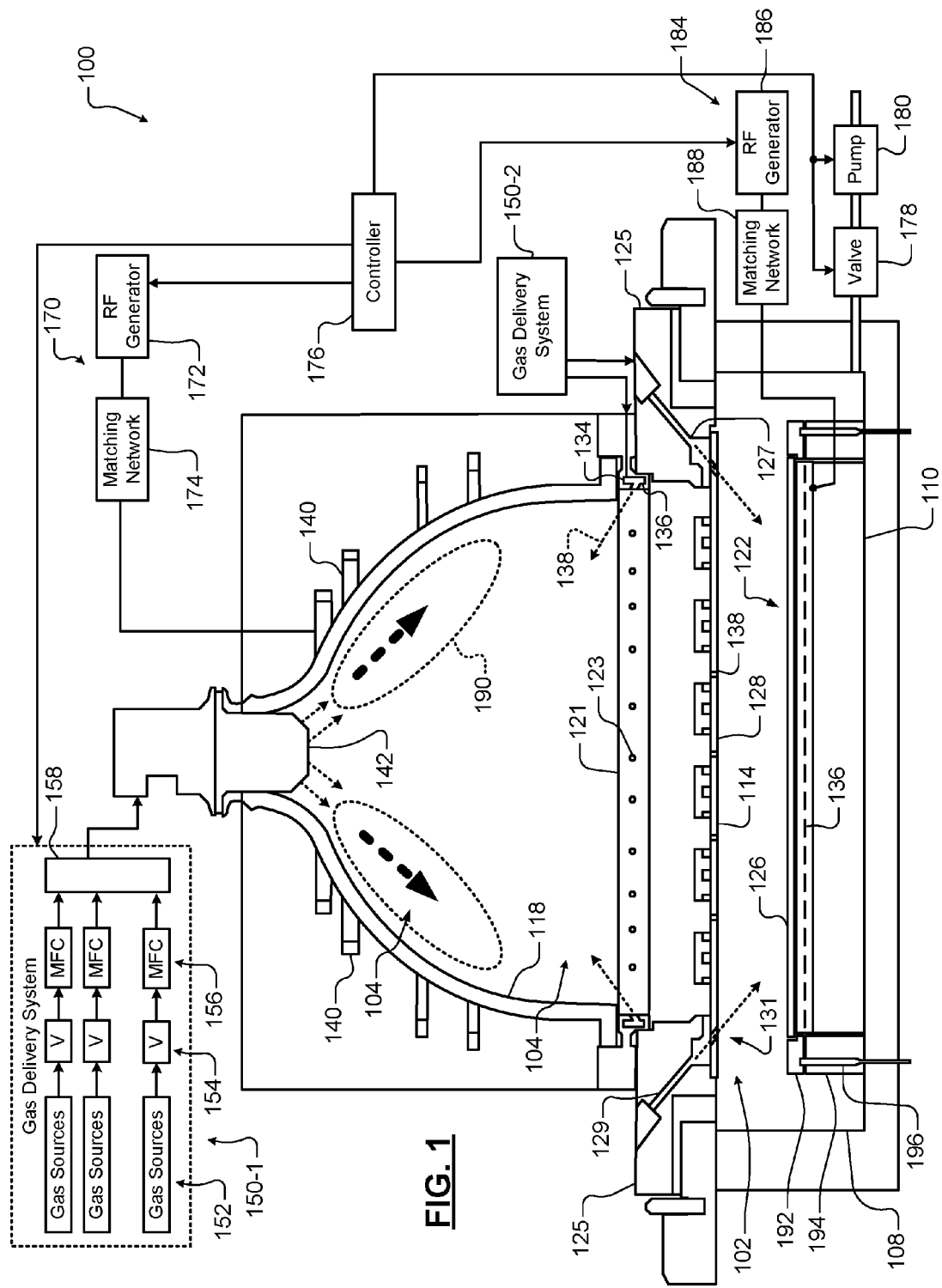
FIG. 1 is a functional block diagram of an example processing chamber according to the present disclosure.

A substrate support in a substrate processing system may include one or more lift pins for lifting a substrate for transfer to and from the substrate support. The lift pins may be arranged below a central or interior portion of the substrate and are actuated upward to contact and lift the substrate from the substrate support.

The substrate support may implement an electromechanical and/or pneumatic lift mechanism to actuate the lift pins. The lift mechanism is relatively expensive and requires additional hardware, maintenance, and facilities servicing beneath the substrate support. In some examples, the lift pins are associated with arcing to the underside of the substrate, hollow cathode discharge in respective cavities of the lift pins, etc. Further, the lift mechanism occupies additional space below the substrate support, complicating the design of the baseplate, heating elements, etc. of the substrate support.

Substrate (i.e., wafer) lift systems and methods according to the principles of the present disclosure implement a lift ring that at least partially surrounds a perimeter of the substrate. An inner edge of the lift ring includes a ledge or lip that supports the substrate. The lift ring is selective raised and lowered by lift pins. For example, some substrate supports are configured to be selectively raised and lowered to adjust a distance between the substrate and a gas distribution device. In some examples of the present substrate lift systems and methods, lowering the substrate support causes lower ends of the lift pins to engage a lift pin stop that is in a fixed position. Accordingly, as the substrate support continues to lower, the lift pins are retained in a fixed position by the lift pin stop, causing the lift ring to lift the substrate from the substrate support. In other examples, the lift pin stop may be selectively raised and lowered to raise and lower the lift pins. In one example, the lift pin stop may be formed of a conductive material that is grounded.

In examples, three lift pins are provided. The lift pins may be equally spaced below the lift ring. The lift pins are constructed from a dielectric material and are arranged in a dielectric ring positioned around an outer perimeter of the substrate support. The lift ring (e.g., a C-shaped ring) may include three recesses (e.g., slotted recesses) arranged to correspond to respective lift pins. For example, the recesses receive respective upper ends of the lift pins to radially align the lift ring about the substrate support. An inner diameter of the lift ring may be marginally less than an outer diameter of the substrate. Accordingly, an inner edge (e.g., a lip or ledge) supports an outer edge of the substrate. For example, the inner edge of the lift ring may include a recess having an outer diameter that is marginally greater than the outer diameter of the substrate.

The lift ring is not continuous (i.e., the lift ring is not a complete, unbroken circle or ring). Rather, a segment (e.g., referred to as a bridge) of the lift ring may be separate from the lift ring to provide an opening when the lift ring is raised from the substrate support. Accordingly, an end effector of a wafer transfer robot can be received within the lift ring via the opening for placement and retrieval of the substrate from the substrate support. The bridge remains stationary relative to the substrate and the substrate support (e.g., an electrostatic chuck, or ESC).

Because the lift pins are not located within the substrate support below the substrate, the lift pins do not affect the thermal uniformity of the surface of the substrate support, thus simplifying and reducing the complexity of any devices used to control thermal uniformity. Further, the lift pins do not provide an arc path to the underside of the substrate, and the cavities corresponding to the lift pins are not located below the substrate and therefore do not facilitate hollow cathode discharge below the substrate.

Referring now to FIG. 1, an example of a substrate processing chamber 100 for etching a layer (for example only, a tungsten, or W, layer) of a substrate according to the present disclosure is shown. While a specific substrate processing chamber is shown and described, the methods described herein may be implemented on other types of substrate processing systems.

The substrate processing chamber 100 includes a lower chamber region 102 and an upper chamber region 104. The lower chamber region 102 is defined by chamber sidewall surfaces 108, a chamber bottom surface 110 and a lower surface of a gas distribution device 114.

The upper chamber region 104 is defined by an upper surface of the gas distribution device 114 and an inner surface of a dome 118. In some examples, the dome 118 rests on a first annular support 121. In some examples, the first annular support 121 includes one or more spaced holes 123 for delivering process gas to the upper chamber region 104, as will be described further below. In some examples, the process gas is delivered by the one or more spaced holes 123 in an upward direction at an acute angle relative to a plane including the gas distribution device 114, although other angles/directions may be used. In some examples, a gas flow channel 134 in the first annular support 121 supplies gas to the one or more spaced holes 123.

The first annular support 121 may rest on a second annular support 125 that defines one or more spaced holes 127 for delivering process gas from a gas flow channel 129 to the lower chamber region 102. In some examples, holes 131 in the gas distribution device 114 align with the holes 127. In other examples, the gas distribution device 114 has a smaller diameter and the holes 131 are not needed. In some examples, the process gas is delivered by the one or more spaced holes 127 in a downward direction towards the substrate at an acute angle relative to the plane including the gas distribution device 114, although other angles/directions may be used.

In other examples, the upper chamber region 104 is cylindrical with a flat top surface and one or more flat inductive coils may be used. In still other examples, a single chamber may be used with a spacer located between a showerhead and the substrate support.

A substrate support 122 is arranged in the lower chamber region 104. In some examples, the substrate support 122 includes an electrostatic chuck (ESC), although other types of substrate supports can be used. A substrate 126 is arranged on an upper surface of the substrate support 122 during etching. In some examples, a temperature of the substrate 126 may be controlled by a heater plate 136, an optional cooling plate with fluid channels, and one or more sensors (not shown), although any other suitable substrate support temperature control system may be used.

In some examples, the gas distribution device 114 includes a showerhead (for example, a plate 128 having a plurality of spaced holes 138). The plurality of spaced holes 138 extend from the upper surface of the plate 128 to the lower surface of the plate 128. In some examples, the spaced holes 138 have a diameter in a range from 0.4" to 0.75" and the showerhead is made of a conducting material such as aluminum or a non-conductive material such as ceramic with an embedded electrode made of a conducting material.

One or more inductive coils 140 are arranged around an outer portion of the dome 118. When energized, the one or more inductive coils 140 create an electromagnetic field inside of the dome 118. In some examples, an upper coil and a lower coil are used. A gas injector 142 injects one or more gas mixtures from a gas delivery system 150-1.

In some examples, a gas delivery system 150-1 includes one or more gas sources 152, one or more valves 154, one or more mass flow controllers (MFCs) 156, and a mixing manifold 158, although other types of gas delivery systems may be used. A gas splitter (not shown) may be used to vary flow rates of a gas mixture. Another gas delivery system 150-2 may be used to supply an etch gas or an etch gas mixture to the gas flow channels 129 and/or 134 (in addition to or instead of etch gas from the gas injector 142).

Suitable gas delivery systems are shown and described in commonly assigned U.S. patent application Ser. No. 14/945,680, entitled "Gas Delivery System" and filed on Dec. 4, 2015, which is hereby incorporated by reference in its entirety. Suitable single or dual gas injectors and other gas injection locations are shown and described in commonly assigned U.S. Provisional Patent Application Ser. No. 62/275,837, entitled "Substrate Processing System with Multiple Injection Points and Dual Injector" and filed on Jan. 7, 2016, which is hereby incorporated by reference in its entirety.

In some examples, the gas injector 142 includes a center injection location that directs gas in a downward direction and one or more side injection locations that inject gas at an angle with respect to the downward direction. In some examples, the gas delivery system 150-1 delivers a first portion of the gas mixture at a first flow rate to the center injection location and a second portion of the gas mixture at a second flow rate to the side injection location(s) of the gas injector 142. In other examples, different gas mixtures are delivered by the gas injector 142. In some examples, the gas delivery system 150-1 delivers tuning gas to the gas flow channels 129 and 134 and/or to other locations in the processing chamber as will be described below.

A plasma generator 170 may be used to generate RF power that is output to the one or more inductive coils 140. Plasma 190 is generated in the upper chamber region 104. In some examples, the plasma generator 170 includes an RF generator 172 and a matching network 174. The matching network 174 matches an impedance of the RF generator 172 to the impedance of the one or more inductive coils 140. In some examples, the gas distribution device 114 is connected to a reference potential such as ground. A valve 178 and a pump 180 may be used to control pressure inside of the lower and upper chamber regions 102, 104 and to evacuate reactants.

A controller 176 communicates with the gas delivery systems 150-1 and 150-2, the valve 178, the pump 180, and/or the plasma generator 170 to control flow of process gas, purge gas, RF plasma and chamber pressure. In some examples, plasma is sustained inside the dome 118 by the one or more inductive coils 140. One or more gas mixtures are introduced from a top portion of the chamber using the gas injector 142 (and/or holes 123) and plasma is confined within the dome 118 using the gas distribution device 114.

Confining the plasma in the dome 118 allows volume recombination of plasma species and effusing desired etchant species through the gas distribution device 114. In some examples, there is no RF bias applied to the substrate 126. As a result, there is no active sheath on the substrate 126 and ions are not hitting the substrate with any finite energy. Some amount of ions will diffuse out of the plasma region through the gas distribution device 114. However, the amount of plasma that diffuses is an order of magnitude lower than the plasma located inside the dome 118. Most of ions in the plasma are lost by volume recombination at high pressures. Surface recombination loss at the upper surface of the gas distribution device 114 also lowers ion density below the gas distribution device 114.

In other examples, an RF bias generator 184 is provided and includes an RF generator 186 and a matching network 188. The RF bias can be used to create plasma between the gas distribution device 114 and the substrate support or to create a self-bias on the substrate 126 to attract ions. The controller 176 may be used to control the RF bias.

The substrate support 122 includes a lift ring 192. The substrate support 122 further includes a support ring 194. Lift pins 196 located within the support ring 194 support the lift ring 192. An inner edge of the lift ring 192 supports and retains the substrate 126. The lift ring 192 according to the principles of the present disclosure is moveable (e.g., moveable upward and downward in a vertical direction) relative to the substrate support 122. For example, when the substrate support 122 is lowered, the lift ring 192 is maintained in a stationary position, causing the substrate 126 to be lifted or raised from the substrate support 122 as described below in more detail. In other examples, the lift pins 196 are raised to lift the lift ring 192 and the substrate 126.

Figure 2A:
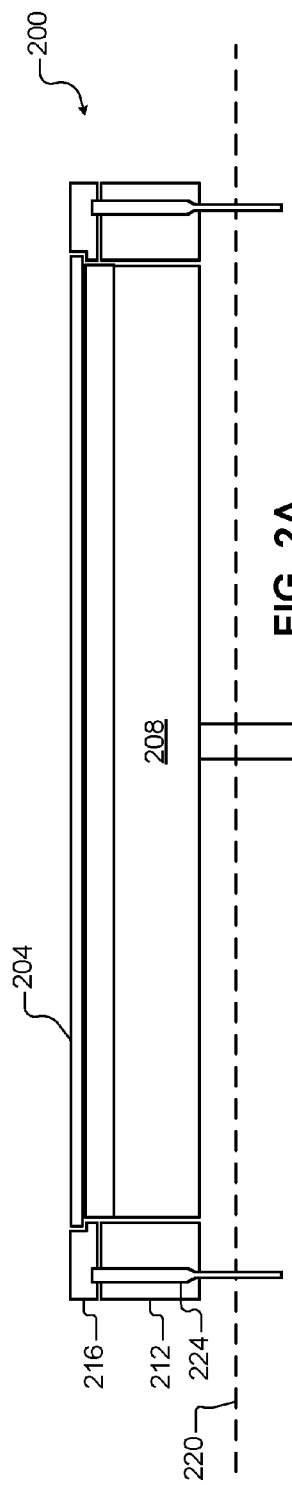
Figure 2B:
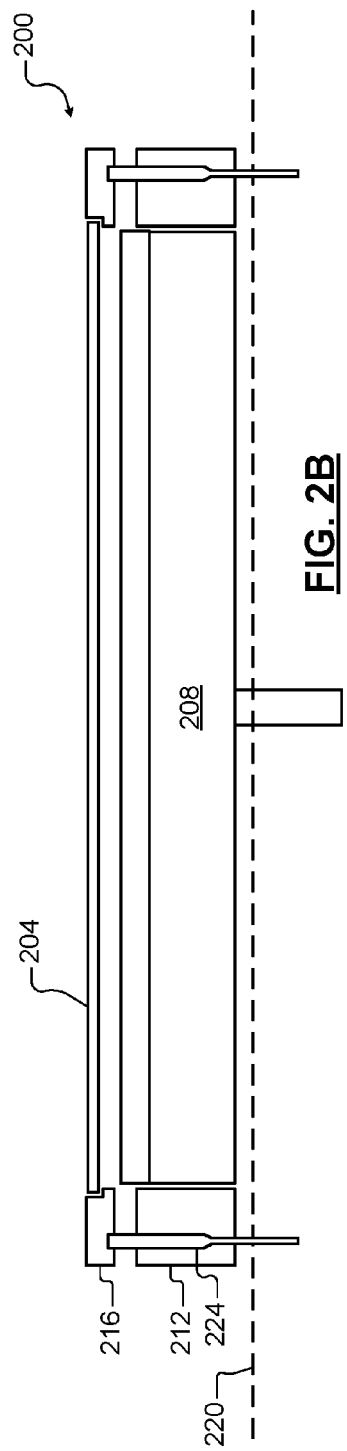
Figure 2C:
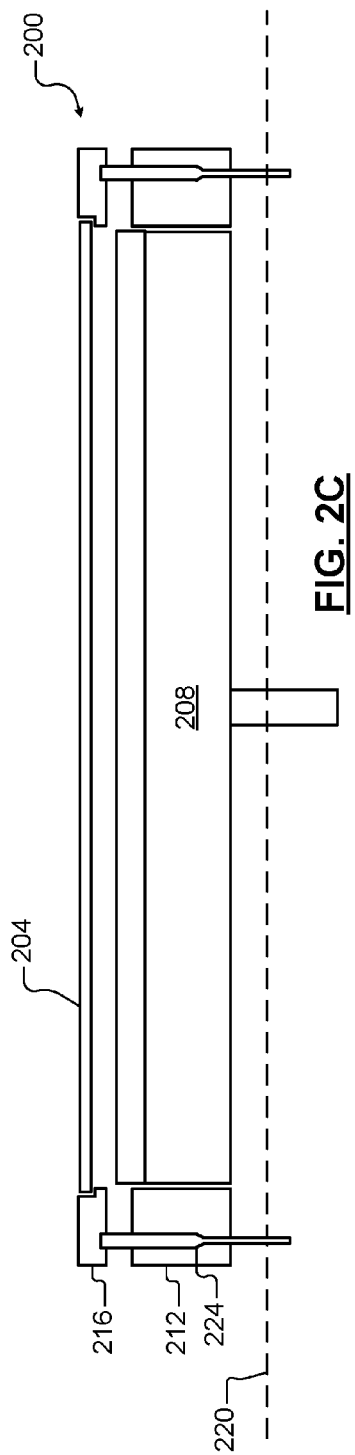

Referring now to FIGS. 2A, 2B, 2C, 2D, and 2E, an example substrate support 200 having a substrate 204 arranged thereon according to the principles of the present disclosure is shown. The substrate support 200 may include a base or pedestal having an inner portion (e.g., corresponding to an ESC) 208 and an outer support ring 212. In FIG. 2A, the substrate support 200 is shown with a lift ring 216 in a fully lowered position. In FIGS. 2B and 2C, the substrate support 200 is shown with the lift ring 216 in a raised position. For example, in FIG. 2B, the substrate support 200, including the inner portion 208 and the outer ring 212, is lowered (e.g., relative to a bottom surface 220 of a substrate processing chamber), while lift pins 224 remain stationary to cause the lift ring 216 to separate from the substrate support 200. Conversely, in FIG. 2C, the lift pins 224 are actuated upward (e.g., relative to the bottom surface 220) to engage and lift the lift ring 216 to the raised position while the substrate support 200 remains stationary. Accordingly, in various examples, the substrate support 200 may be configured such that the lift ring 216 can be raised relative to the substrate support 200 to raise the substrate 204 to a transfer position and/or such that the substrate support 200 can be lowered to cause the lift ring 216 and the substrate 204 to be raised to the transfer position.

FIGS. 2D and 2E show the lift ring 216 and the substrate 204 in more detail (in a close-up and in a plan view, respectively). An inner edge 228 of the lift ring 216 corresponds to a ledge or lip that supports an outer edge 232 of the substrate 204. For example, the lift ring 216 includes a recess 236 that accepts the outer edge 232 of the substrate 204. For example, an inner diameter of the inner edge 228 of the lift ring 216 is less than an outer diameter of the outer edge 232 of the substrate 204. Conversely, an outer diameter of the recess 236 is greater than the outer diameter of the outer edge 232 of the substrate 204. As shown in FIG. 2D, a bottom surface of the lift ring 216 includes respective recesses 240 configured to receive respect lift pins 224. Accordingly, the recesses 240 capture and retain the lift pins 224, and the lift pins 224 correspondingly maintain radial alignment of the lift ring 216.

As shown in FIG. 2E, the lift ring 216 includes a bridge 244. The bridge 244 is separate from the lift ring 216 and is thereby maintained in a stationary position with respect to the substrate support 200 and the lift ring 216. Accordingly, in examples where the lift ring 216 is raised relative to the substrate support 200, the bridge 244 is not raised and is thereby separated from the lift ring 216. Conversely, in examples where the substrate support 200 is lowered relative to the lift ring 216, the bridge 244 is also lowered and thereby separated from the lift ring 216. When the bridge 244 and the lift ring 216 are separated, an opening 248 is defined in the lift ring 216. For example, the lift ring 216 may be "C"-shaped and the bridge is aligned with the opening 248 of the "C". The opening 248 allows the lift ring 216 to receive an end effector of a wafer transfer robot to capture and transfer the substrate 204 from the lift ring 216.

The bridge 244 abuts the lift ring 216 at joints 252. For example, the joints 252 correspond to lap joints (e.g., ends of the lift ring 216 overlap respective ends of the bridge 244. The joints 252 may be configured to minimize a free volume in a space between the respective ends of the lift ring 216 and the bridge 244 to prevent parasitic plasma ignition in the joints 252. As shown, the joints 252 correspond to radial cuts (i.e., the joints 252 correspond to lines normal to a circle defined by the lift ring 216). Accordingly, the joints 252 form a right angle with respective edges of the bridge 244 and the lift ring 216. In other examples, the joints 252 may be formed at different angles.

Figure 3:
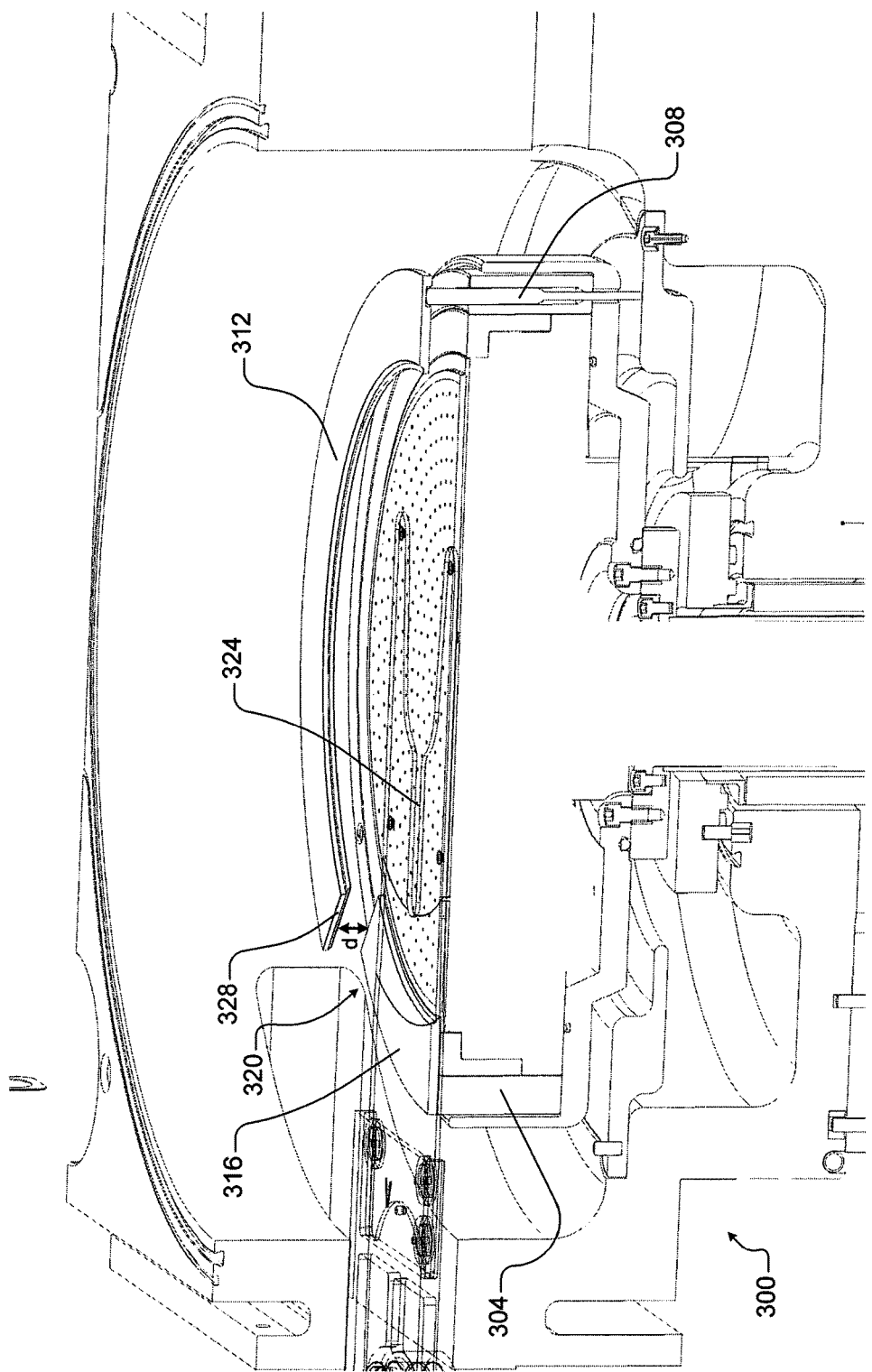
FIG. 3 shows a cross-section of an example substrate supports having a lift ring according to the present disclosure.

FIG. 3 shows a cross-section of another example substrate support 300. The substrate support 300 includes an outer ring 304 supporting lift pins 308. The lift pins 308 support a lift ring 312. The lift ring 312 is shown in a raised position (e.g., corresponding to the lift pins 308 being actuated to a raised position and/or the substrate support 300 being actuated to a lowered position).

The lift ring 312 includes a bridge 316 that is separate from the lift ring 312. The bridge 316 is maintained in a stationary position such that the bridge 316 is separated from the lift ring 312 when the lift ring 312 is raised and/or the substrate support 300 is lowered. Separating the bridge 316 from the lift ring 312 (i.e., by adjusting a height of the lift ring 312 to a transfer height) defines an opening 320 in the lift ring 312. The opening 320 allows the lift ring 312 to receive an end effector 324 for transfer of a substrate to and from the lift ring 312. Ends 328 of the lift ring 312 are configured to form lap joints with the bridge 316. For example only, the transfer height may correspond to a thickness of an end effector of a robot configured to transfer substrates to and from the lift ring 312. In other words, the transfer height corresponds to a height where a distance d between a bottom surface of the substrate and an upper surface of the bridge 316 is at least greater than a thickness of the end effector to allow the end effector to be inserted between the substrate and the bridge 316.

Figure 4A:
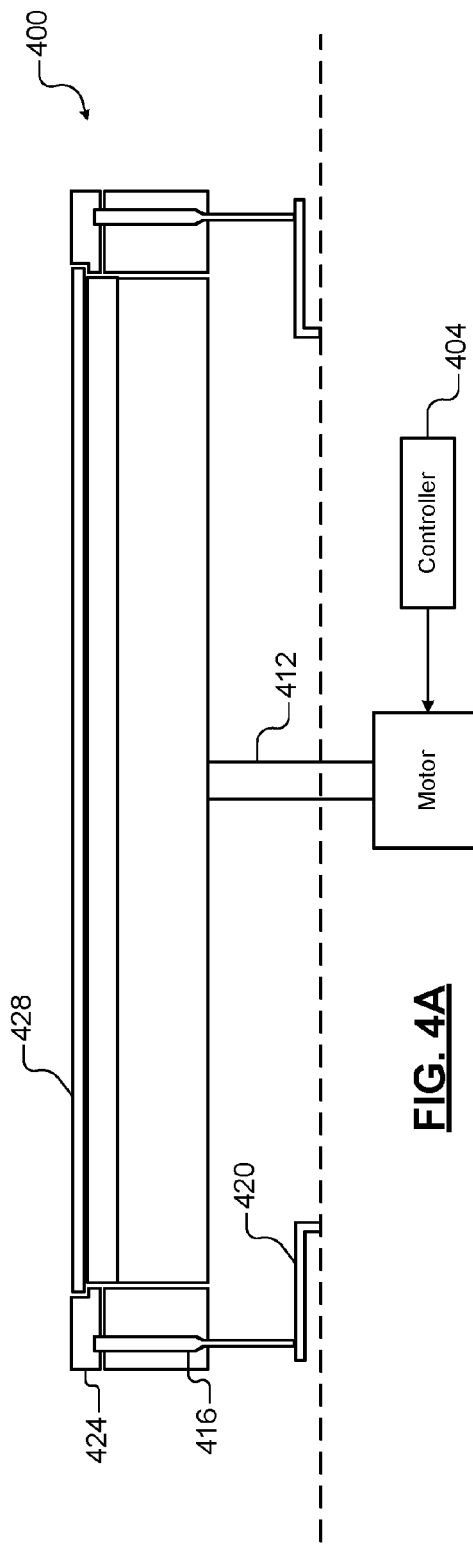
FIGS. 4A and 4B show an example lift ring in a raised position and a lowered position according to the present disclosure.
Figure 4B:
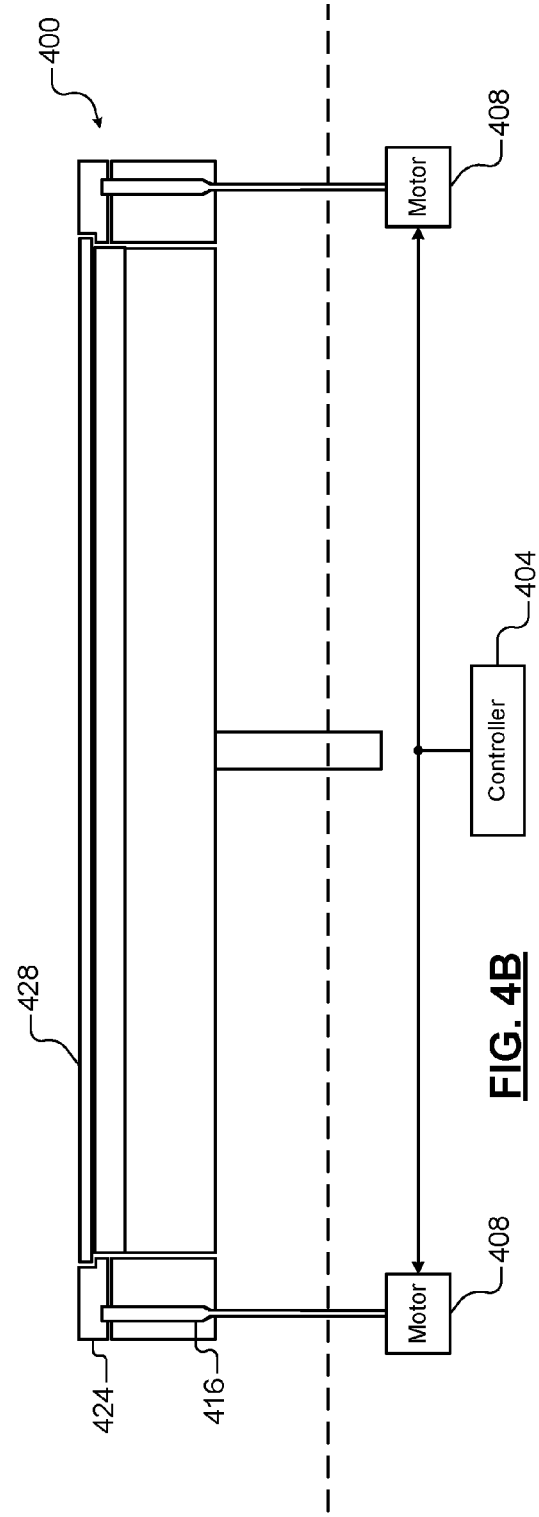

FIGS. 4A and 4B show example implementations of lift mechanisms for substrate support 400. In FIG. 4A, a controller 404 controls a motor or actuator 408 to selectively raise and lower the substrate support 400. For example only, the motor 408 rotates a drive shaft or screw 412 to selectively raise and lower the substrate 400. As the substrate support 400 lowers, lift pins 416 engage lift pin stops 420, causing lift ring 424 and substrate 428 to remain stationary. Accordingly, the lift ring 424 is raised relative to the substrate support 400.

Conversely, in FIG. 4B, the controller 404 controls motors 408 to selectively raise and lower the lift pins 416 while the substrate support 400 remains stationary. Accordingly, the lift ring 424 is raised relative to the substrate support 400.

Figure 5:
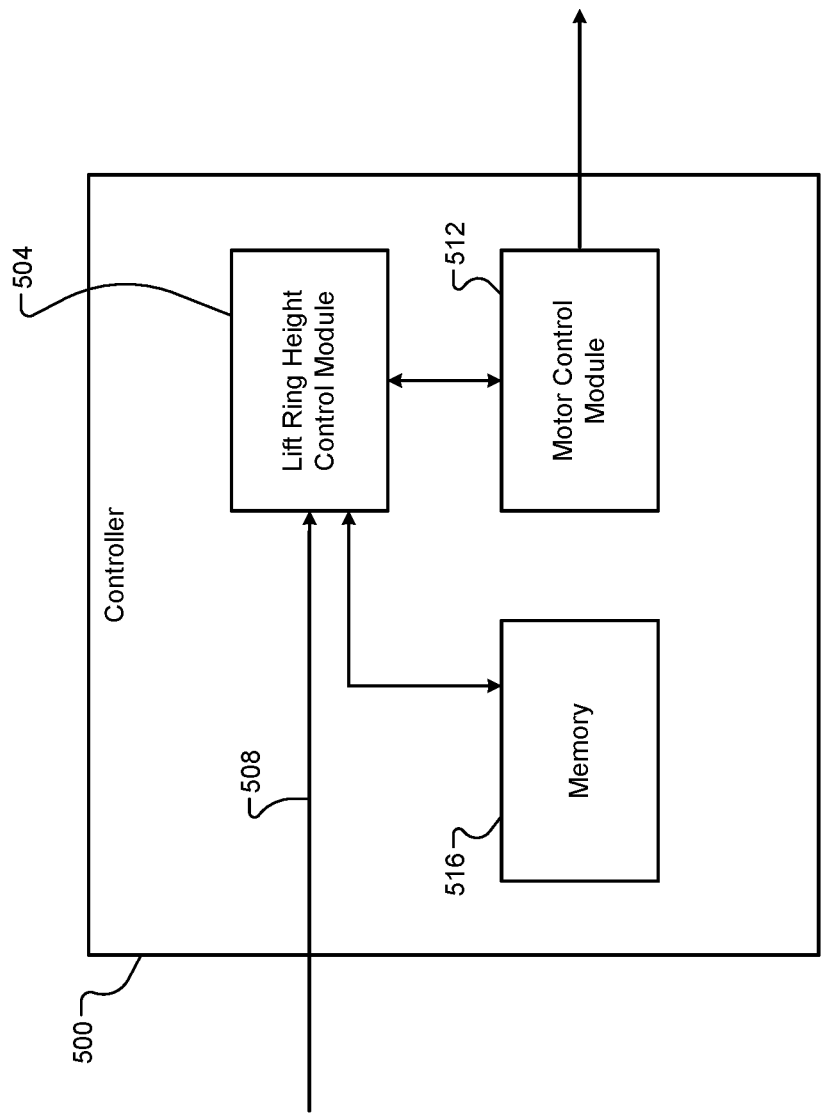
FIG. 5 shows an example controller according to the present disclosure.

Referring now to FIG. 5, an example controller 500 (e.g., corresponding to the controller 404) includes a lift ring height control module 504 configured to selectively control a height of a lift ring relative to a substrate support. The lift ring height control module 504 receives one or more inputs 508 including, but not limited to, inputs indicating that a substrate is being transferred to or retrieved from a processing chamber. For example, the inputs 508 may include an indication that processing on the substrate has been completed, that a user has manually requested (e.g., via an external interface) transfer or retrieval of the substrate, etc. In some examples, the inputs 508 may include a signal transmitted from a robot or robot controller indicating that the robot is positioned to transfer or retrieve the substrate.

The lift ring height control module 504 controls the height of the lift ring in response to the inputs 508. For example, the lift ring height control module 504 communicates with a motor control module 512. The motor control module 512 outputs one or more control signals responsive to the lift ring height control module 504 to control respective motors (e.g., the motor 408 shown in FIG. 4A, the motors 408 shown in FIG. 4B, etc.)

In some examples, the controller 500 includes a memory 516 that stores data associated with control of the height of the lift ring. The stored data may include a program, algorithm, model, etc. retrieved and/or executed by the lift ring height control module 504. For example, the data may include control parameters associated with controlling the lift ring height based on various conditions indicated by the received inputs 508.

Figure 6:
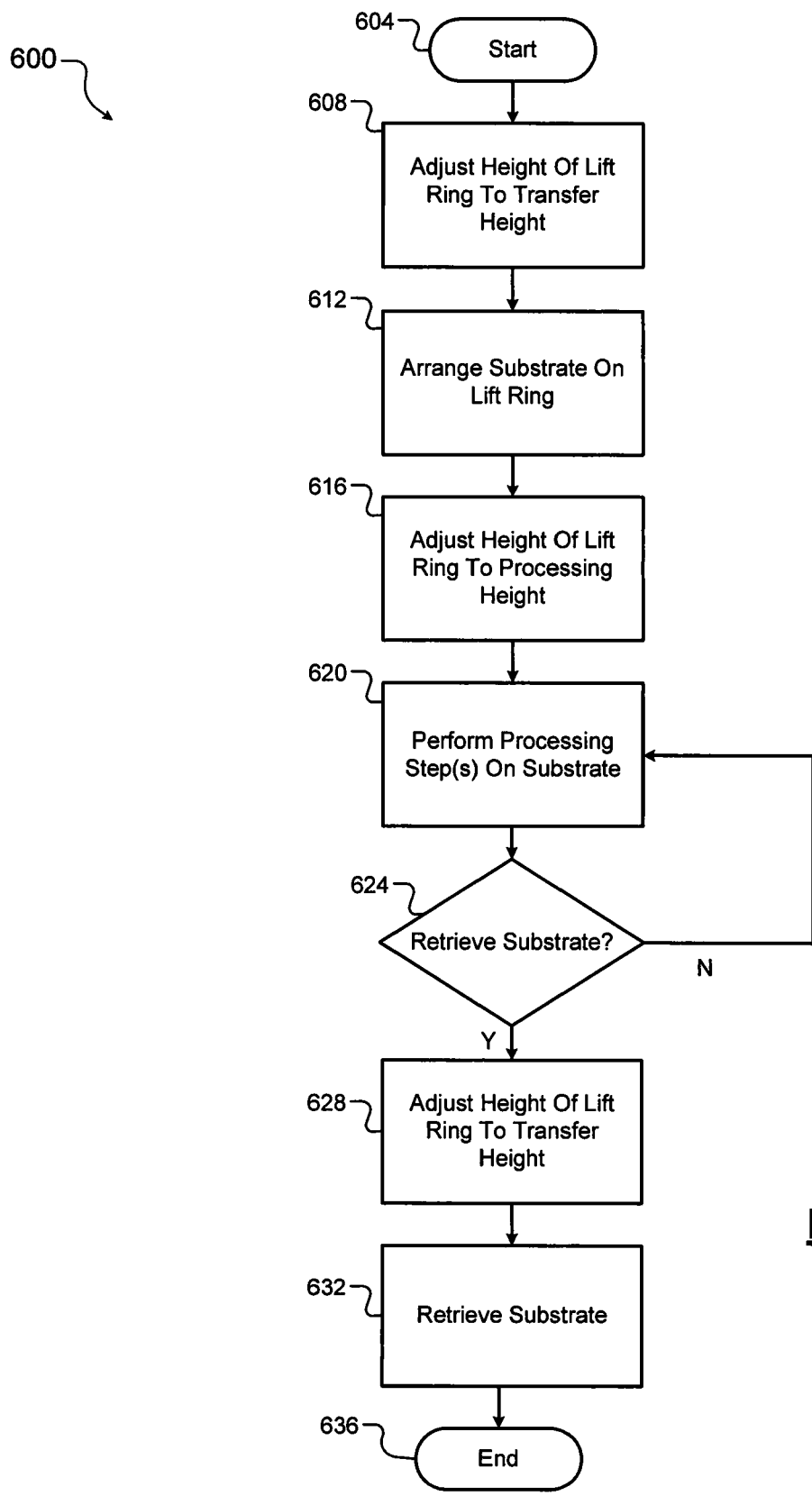
FIG. 6 shows steps of an example method for adjusting a height of a lift ring to transfer a substrate according to the present disclosure.

Referring now to FIG. 6, an example method 600 for adjusting a height of a lift ring to transfer a substrate according to the present disclosure begins at 604. At 608, a height of a lift ring relative to a substrate support is adjusted to a transfer height (e.g., using the controller 500). For example, the lift ring is raised or an inner portion of substrate support is lowered as described above in FIGS. 1-5. For example only, the transfer height may correspond to a thickness of an end effector of a robot configured to transfer substrates to and from the lift ring. In other words, the transfer height corresponds to a height where a distance between a bottom surface of the substrate and an upper surface of the bridge is at least greater than a thickness of the end effector to allow the end effector to be inserted between the substrate and the bridge. In one example, the memory 516 may store a lookup table or other data correlating one or more transfer robots with respective transfer heights. In other words, the controller 500 may be configured to adjust the lift ring to a sufficient transfer height based on dimensions of the transfer robot (e.g., a thickness of an end effector of the robot).

At 612, the substrate is arranged on the lift ring. At 616, the height of the lift ring is adjusted to a processing height (i.e., the substrate is arranged on the substrate support by lowering the lift ring or raising the inner portion of the substrate support). At 620, one or more processing steps are performed on the substrate. At 624, the method 600 (e.g., the controller 500) determines whether to retrieve the substrate. For example, the controller 500 may determine that processing is complete and the robot is in position to retrieve the substrate. If true, the method 600 continues to 628. If false, the method 600 continues to 620.

At 628, the height of the lift ring is adjusted to the transfer height. At 632, the substrate is retrieved from the lift ring. The method 600 ends at 636.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

None of the elements recited in the claims are intended to be a means-plus-function element within the meaning of 35 U.S.C. § 112(f) unless an element is expressly recited using the phrase "means for," or in the case of a method claim using the phrases "operation for" or "step for."

What is claimed is:

1. A substrate support, comprising:
   an inner portion arranged to support a substrate;
   a lift ring surrounding the inner portion, the lift ring arranged to support an outer edge of the substrate wherein
      the lift ring includes a C-shaped portion and a bridge portion,
      the C-shaped portion is moveable with respect to the inner portion and the bridge portion is stationary with respect to the inner portion,
      the C-shaped portion includes an opening when the bridge portion is separated from the C-shaped portion, and
      ends of the C-shaped portion overlap respective ends of the bridge portion; and
   a controller configured to control an actuator to adjust a height of the lift ring relative to the inner portion by selectively raising and lowering at least one of (i) the lift ring and (ii) the inner portion of the substrate support,
   wherein, to adjust the height of the lift ring, the controller selectively
      adjusts the height of the lift ring to a transfer height for transfer of the substrate to the lift ring and retrieval of the substrate from the lift ring, and
      adjusts the height of the lift ring to a processing height for processing of the substrate, wherein the processing height is lower than the transfer height.

2. The substrate support of claim 1, wherein the substrate support includes an outer ring surrounding the inner portion, wherein the outer ring houses at least one lift pin arranged to engage a bottom surface of the lift ring.

3. The substrate support of claim 1, wherein an inner edge of the lift ring includes a lip arranged to support the substrate.

4. The substrate support of claim 1, wherein an inner edge of the lift ring includes a recess arranged to receive the substrate.

5. The substrate support of claim 1, wherein a bottom surface of the lift ring includes at least one recess arranged to receive a lift pin housed in the substrate support.

6. The substrate support of claim 1, wherein joints between the C-shaped portion and the bridge portion form right angles with respective inner and outer edges of the C-shaped portion and the bridge portion.

7. A method of operating a substrate support, the method comprising:
   providing a lift ring, wherein the lift ring is arranged to surround an inner portion of the substrate support and to support an outer edge of a substrate, wherein
      the lift ring includes a C-shaped portion and a bridge portion,
      the C-shaped portion is moveable with respect to the inner portion and the bridge portion is stationary with respect to the inner portion,
      the C-shaped portion includes an opening when the bridge portion is separated from the C-shaped portion, and
      ends of the C-shaped portion overlap respective ends of the bridge portion; and
   controlling an actuator to adjust a height of the lift ring relative to the inner portion by selectively raising and lowering at least one of (i) the lift ring and (ii) the inner portion of the substrate support,
   wherein adjusting the height of the lift ring includes selectively
      adjusting the height of the lift ring to a transfer height for transfer of the substrate to the lift ring and retrieval of the substrate from the lift ring, and
      adjusting the height of the lift ring to a processing height for processing of the substrate, wherein the processing height is lower than the transfer height.

8. The method of claim 7, further comprising providing an outer ring surrounding the inner portion, wherein the outer ring houses at least one lift pin arranged to engage a bottom surface of the lift ring.

9. The method of claim 7, wherein an inner edge of the lift ring includes a lip arranged to support the substrate.

10. The method of claim 7, wherein an inner edge of the lift ring includes a recess arranged to receive the substrate.

11. The method of claim 7, wherein a bottom surface of the lift ring includes at least one recess arranged to receive a lift pin housed in the substrate support.

12. The method of claim 7, wherein joints between the C-shaped portion and the bridge portion form right angles with respective inner and outer edges of the C-shaped portion and the bridge portion.

\* \* \* \* \*